United States Patent
Shimizu et al.

[11] Patent Number: 5,466,641
[45] Date of Patent: Nov. 14, 1995

[54] PROCESS FOR FORMING POLYCRYSTALLINE SILICON FILM

[75] Inventors: Tetushi Shimizu, Utsunomiya; Munetaka Koda, Chiba; Yoshikatsu Shida, Chiba; Jun-ichi Kawaguchi, Chiba; Yoshio Kaneko, Chiba, all of Japan

[73] Assignee: Kawasaki Steel Corporation, Kobe, Japan

[21] Appl. No.: 79,123

[22] Filed: Jun. 14, 1993

[30] Foreign Application Priority Data

Jun. 15, 1992 [JP] Japan ................................. 4-155442
Jan. 29, 1993 [JP] Japan ................................. 5-013743

[51] Int. Cl.$^6$ ........................................ H01L 21/469
[52] U.S. Cl. ........................ 437/233; 437/109; 437/967
[58] Field of Search ............................. 437/225, 233, 437/101, 109, 967; 136/258, 261

[56] References Cited

U.S. PATENT DOCUMENTS 4,897,360 1/1990 Guckel et al. ................... 437/233
5,242,855 9/1993 Oguro ................................ 437/109

FOREIGN PATENT DOCUMENTS 0004208 1/1985 Japan.
64-48411 2/1989 Japan ................................ 437/233

Primary Examiner—R. Bruce Breneman
Attorney, Agent, or Firm—Bardehle & Partners

[57] ABSTRACT

An object of this invention is to provide a process for forming a practical polycrystalline silicon film of large crystal grain diameters, which is for use in channels of thin film transistors. The polycrystalline silicon film is formed by surface-pretreating a surface of a silicon oxide film as the undermost layer with an etching liquid, e.g., rinsing the surface with an etching liquid, such as hydrogen fluoride, ammonium hydrogen peroxide or others, then depositing an amorphous silicon film, and annealing the amorphous silicon film.

23 Claims, 4 Drawing Sheets

(a) WITHOUT SURFACE TREATMENT (b) WATER RINSE (c) DILUTED HYDROFLUORIC ACID TREATMENT (a) WITHOUT SURFACE TREATMENT (b) DILUTED HYDROFLUORIC ACID TREATMENT

PROCESS FOR FORMING POLYCRYSTALLINE SILICON FILM

BACKGROUND OF THE INVENTION

1. Field of the Invention

This invention relates to a process for forming a polycrystalline silicon film, usually referred to as polysilicon film, which is suitably used in semiconductor devices, especially in channels of thin film transistors (TFTs).

2. Related Background Art

In forming a polycrystalline silicon film on a silicon wafer for the fabrication of a TFT, conventionally an amorphous silicon film is deposited on the surface of a silicon oxide film as a substrate covering a silicon wafer, continuously without any treatment step intervening, and next annealed for crystallization, whereby a polycrystalline silicon film for the channel of the TFT is formed.

FIGS. 1 to 3 show the steps of forming the polycrystalline silicon film on the silicon oxide film as described above. First as in FIG. 1, a silicon wafer 1 is covered in an about 600 nm-thickness silicon oxide film 2 ($SiO_2$) as the substrate, and then immediately an about 50 nm-thickness amorphous silicon film (a-Si) 3 is deposited on the silicon oxide film 2 as in FIG. 2.

Then, the wafer is loaded into an annealing furnace to be annealed at 600° C. for, e.g., about 3 hours, whereby the amorphous silicon film 3 is crystallized, and as in FIG. 3, a polycrystalline silicon film 4 is formed on the silicon oxide film 2.

The technique for depositing the amorphous silicon film 3 on the silicon oxide film 2 is generally a known technique, such as low-pressure CVD(Chemical Vapor Deposition), vacuum deposition, or others. One of the significant problems in fabricating a practical TFT is that the off current of the TFT is stably retained below 0.25 pA/gate, i.e., the standby current is retained below 1 μA.

As processes for forming a polycrystalline silicon film which can solve this problem, the following two processes, for example, are presented in "NIKKEI MICRODEVICES" (March, 1990. pp. 64–71).

In a first one of these processes, crystal grain diameters of a polycrystalline silicon film to provide a channel are increased so as to reduce grain boundaries through which an off current flows. The above-mentioned amorphous silicon film is deposited at a relatively low temperature (480°–550° C.) so as to lower a generation rate of crystalline nuclei. In a second process, grain diameters of a polycrystalline silicon film to provide a channel are made uniform to a suitable extent, and the film thickness of the polycrystalline silicon film is decreased, whereby a reduced off current is obtained.

The above-described reference describes especially that disilane ($Si_2H_6$), whose activation energy is low, is used in place of silane ($SiH_4$) gas for the fabrication of TFTs, and the deposition temperature of an amorphous silicon film is set at about 480° C., whereby a polycrystalline silicon film of an about 3 μm-grain diameter can be formed (the first process).

In the conventional processes for forming a polycrystalline film, as described above, since the deposition of an amorphous silicon film and the annealing thereof for the crystallization immediately following the formation of a silicon oxide film causes a state in which crystalline nuclei tend to be generated, in the annealing, at the interface between the silicon oxide film and the amorphous silicon film takes place, a number of crystalline nuclei are generated in the annealing, with the result that a crystal grain diameter after the crystallization is suppressed to about 1 μm at largest.

Furthermore, although it is possible to form a polycrystalline silicon film of large grain diameters by the conventional process for forming a polycrystalline silicon film as described in the above reference (the first process), the inventors confirmed by comparison tests that an amorphous silicon film is deposited in a film thickness of 50 nm by a low-pressure CVD apparatus under the conditions of $Si_2H_6$ gas, 480° C. and a film forming speed of 1 nm/min, and annealed at 600° C. for 3 hours (the usual annealing time), whereby the resultant polycrystalline silicon film can have a crystal grain diameter of about 1 μm, and to grow the crystal grain diameter up to about 3 μm, it is necessary to form the polycrystalline silicon film at a speed above 5 nm/min.

Accordingly, the process for forming a polycrystalline silicon film described in the above reference can form a polycrystalline silicon film of a large grain diameter. But because of its high film forming speed, the film thickness uniformity of the polycrystalline silicon film is ±3% at a film forming speed of 1 nm/min, but at a film forming speed above 5 nm/min the uniformity is adversely above 10%.

SUMMARY OF THE INVENTION

This invention was made to solve the above-described problem and provides especially as a technique for fabricating practical TFTs a process for forming a polycrystalline silicon film which can reduce a number of crystalline nuclei generated at the interface between a silicon oxide film as a substrate and an amorphous silicon film, and enables the polycrystalline silicon film to have a larger crystal grain diameter and good film thickness uniformity.

The process for fabricating a polycrystalline silicon film according to this invention is intended for forming a polycrystalline silicon film to be used in the channels of semiconductor devices, especially in thin film transistors. This process is characterized in that the surface of a, silicon oxide film as the substrate it is pretreated, e.g. rinsed with an etching liquid, e.g., hydrogen fluoride, ammonium hydrogen peroxide or others (this pretreatment is hereinafter called surface treatment), and then an amorphous silicon film is deposited, and annealed and crystallized, and a polycrystalline silicon film is formed.

In the surface-treatment, the surface of the silicon oxide film may be treated, in addition to the above-mentioned etching liquid, with an etching gas, water vapor or an atmosphere of hydrogen-content plasma which etch the surface of the silicon oxide film, or may be rinsed with water.

This process is also characterized in that the amorphous silicon film is a film deposited by CVD using at least one of silane ($SiH_4$), disilane ($Si_2H_6$) and trisilane ($Si_3H_8$), and in this step the amorphous silicon film is doped with impurities such as, e.g., phosphorus, or others.

The silicon oxide film as the substrate is a thin film oxidizing the surface of a silicon wafer, or a CVD film covering the silicon wafer in a required thickness.

The process for forming a polycrystalline silicon film according to this invention is characterized in that prior to the formation of an amorphous silicon film which has been conventionally deposited immediately after the formation of silicon oxide film as the substrate, the surface of the silicon oxide film is surface-pretreated with an etching liquid, such as hydrogen fluoride, ammonium hydrogen peroxide or others, an etching gas, such as hydrogen fluoride or others, water, water vapor, or an atmosphere of hydrogen-containing plasma.

The reason for the step of depositing an amorphous silicon film on a silicon oxide film following the step of the above-described surface treatment is the finding based on the inventor's studies of relationships between a state of the surface of the silicon oxide film, and a crystal grain diameter of the polycrystalline silicon formed by crystallizing the amorphous film deposited on the silicon oxide film. The number of OH groups bonded with the silicon atoms of the surface of the silicon oxide film is increased, whereby the generation of crystalline nuclei from the amorphous silicon film can be suppressed. The reason for this phenomenon may be that the hydrogen atoms of OH groups prevent the silicon atoms in the amorphous silicon film from bonding with the silicon atoms in the Silicon oxide film as the substrate. The outermost surface of a silicon oxide film formed usually by exposing the surface of a silicon wafer to an atmosphere of oxygen is covered with Si—H and distorted Si—O bonds.

On this surface an amorphous silicon film is deposited and annealed at 600° C. Instantaneously the silicon atoms in the amorphous silicon oxide film destroy the distorted Si—O bonds to form alignments (crystalline nuclei) of some silicon atoms with this silicon oxide film.

The inventors confirmed that a number of the crystalline nuclei in the polycrystalline silicon film is as many as $100/\mu m^2$ when the amorphous silicon film is deposited immediately after the oxidation (immediately after the formation of a silicon oxide film) and annealed at a temperature above 600° C., and the polycrystalline silicon film was formed.

Thus increasing a crystal grain diameter of the polycrystalline silicon film makes it possible to decrease grain boundaries where an impurity (e.g., phosphorus) which will be doped in the polycrystalline silicon film and diffused into the silicon oxide film as the substrate is present in a high concentration.

In view of this, in this invention, the above-described surface treatment is pre-conducted before the formation of an amorphous silicon film to terminate the silicon atoms in the surface of a silicon oxide film with OH groups, so that a number of crystalline nuclei to be generated is reduced, whereby a crystal grain density after the crystallization is made low, and a polycrystalline silicon film of the large grain diameter can be formed.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

The process for forming a polycrystalline silicon film according to this invention will be explained by means of embodiments with reference to FIGS. 4 to 11. FIGS. 4 to 9 are explanatory views of the steps of the process for forming a polycrystalline silicon film according to this invention, especially for forming a polycrystalline silicon film for use in the channels of TFTs. In the first embodiment, the surface of a silicon oxide film as the substrate is rinsed with hydrogen fluoride as an etching liquid before the deposition of an amorphous silicon film.

Figure 4:
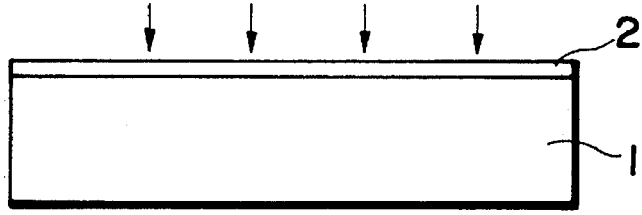
FIGS. 4 to 9 are views of steps of the process for forming a polycrystalline silicon film according to this invention.

As in FIG. 4, the surface of a silicon wafer 1 is oxidized at 950° C. with water vapor to form a silicon oxide film 2 in an about 600 nm-thickness. Then, the surface of the silicon oxide film 2 is rinsed with hydrogen fluoride as the surface treatment (at this time, the surface of the silicon oxide film 2 is etched by about 0.1–0.2 nm).

Subsequently, as in FIG. 5, an amorphous silicon film 3 is deposited in a thickness of about 50 nm on the silicon oxide film 2 by the CVD. Then the amorphous silicon film 3 is processed into an isle and annealed for about 3 hours at 600° C., and as in FIG. 6, a polycrystalline silicon film 4 is formed.

Figure 1:
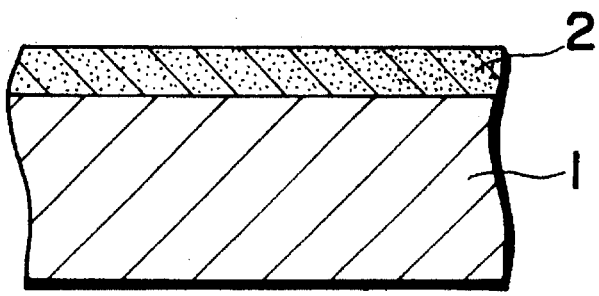
FIGS. 1 to 3 are views of steps of the conventional process for forming a polycrystalline silicon film.
Figure 2:
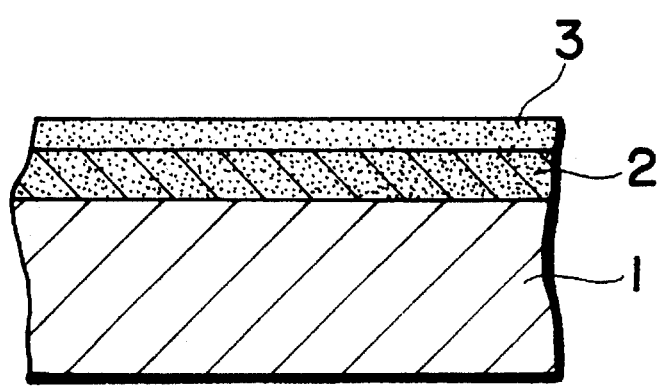
Figure 3:
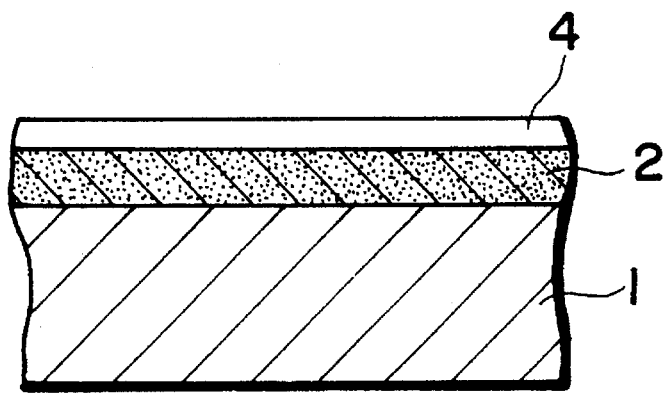

It was confirmed that the crystal grain density of the polycrystalline silicon film 4 formed by following the above-described steps can be reduced down to about 1/100 as shown in FIG. 10(c) in comparison with the crystal grain density (FIG. 10(a)) of a polycrystalline silicon film 4 formed by the conventional process (FIGS. 1–3). Also in terms of crystal grain diameter it was confirmed that, as in FIG. 11, the crystal grain diameter of the polycrystalline silicon film 4 formed by the process according to the first embodiment is about 3 μm (FIG. 11(b)), which is enlarged in comparison with the crystal grain diameter of 0.8 μm (FIG. 11(a)) of the polycrystalline silicon film 4 formed by the conventional process.

Figure 7:
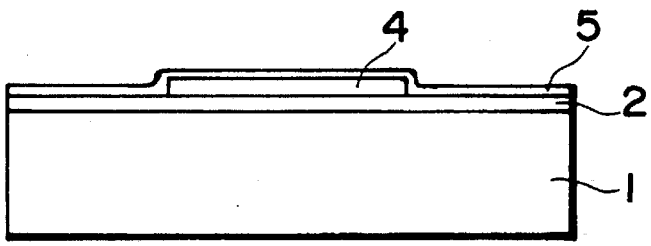
Figure 8:
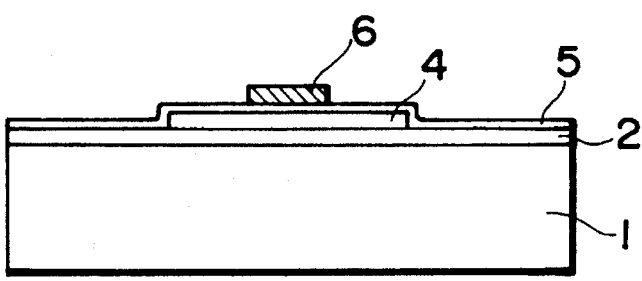

Next, as in FIG. 7, a gate oxide film 5 is deposited on the polycrystalline silicon film 4 by CVD, and subsequently a gate electrode 6 is formed (FIG. 8). The gate electrode 6 is made of a polycrystalline silicon or a silicide.

Figure 9:
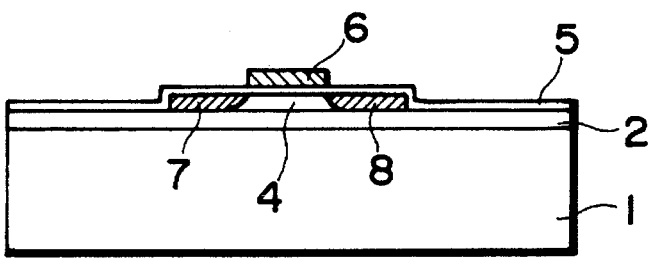
Figure 10:
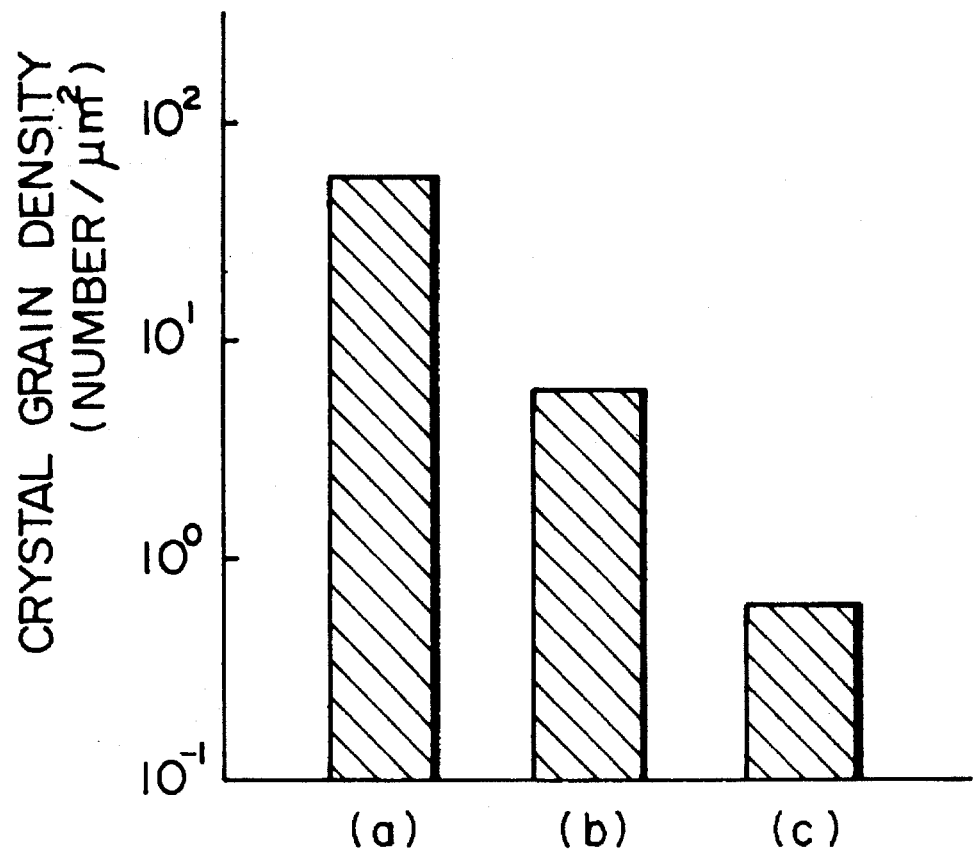
FIG. 10 is a view for the comparison in crystal grain density between the polycrystalline silicon film formed by the process according to this invention and the polycrystalline silicon film formed by the conventional process.
Figure 11:
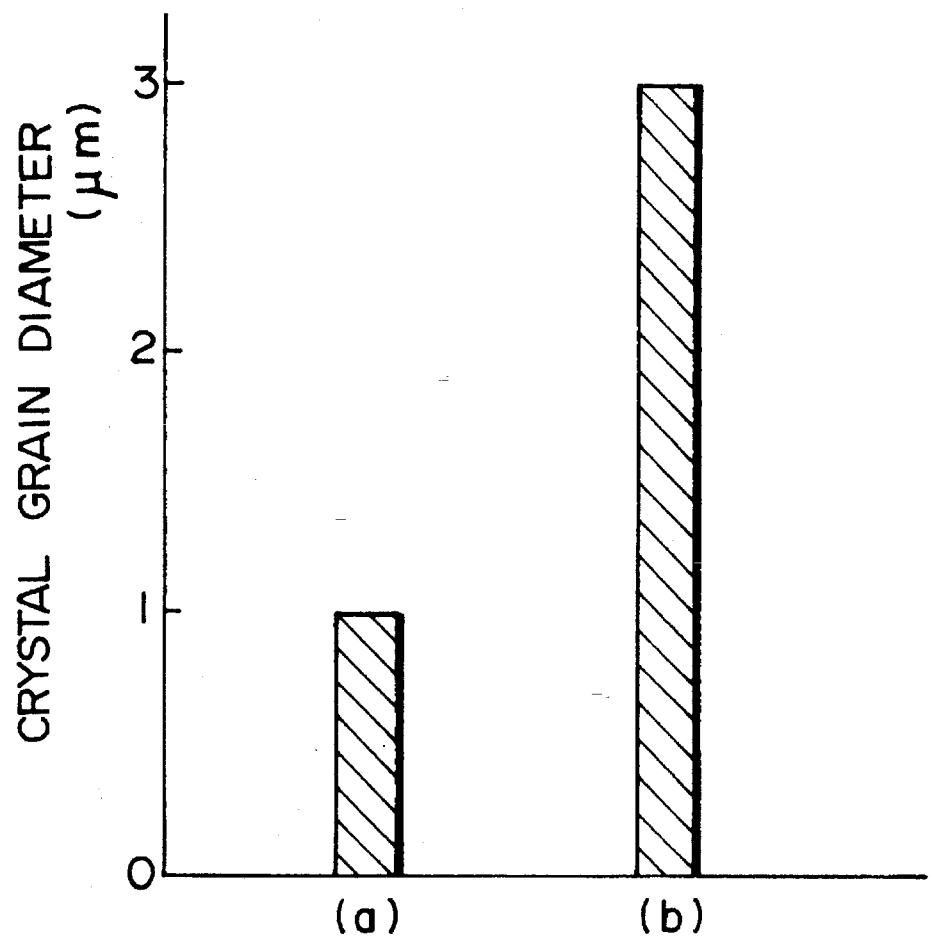
FIG. 11 is a view for the comparison in grain diameter between the polycrystalline silicon film formed by this invention and the polycrystalline silicon film formed by the conventional process.

Finally, as in FIG. 9, with the gate electrode 6 as the mask, a source region 7 and a drain region 8 are formed in self-alignment. Then a wiring step follows, and a TFT is completed.

Next, a second embodiment in which the surface treatment is conducted with hydrogen fluoride as an etching gas will be explained also with reference to FIGS. 4 to 9 as in the first embodiment.

As in FIG. 4, the surface of a silicon wafer 1 is oxidized at 950° C. with water vapor of to form a silicon oxide film 2 in an about 600 nm-thickness. Then the surface of the silicon oxide film 2 is exposed, as the surface treatment, to hydrogen fluoride gas of a 0.01 partial pressure "(ratio of pressure of hydrogen fluoride gas to total pressure)" at the room temperature for 10 seconds (at this time, the surface of the silicon oxide film 2 is etched by about 0.1–0.2 nm).

Then as in FIG. 5, an amorphous film 3 is deposited in a film thickness of about 50 nm on the silicon oxide film 2 by CVD with $Si_2H_6$ gas at 480° C. and subsequently annealed for about 3 hours at 600° C. And as in FIG. 6, a polycrystalline silicon film 4 is formed: (The steps 7 to 9 follow as in the first embodiment.)

It was confirmed the crystal grain diameter of the thus-formed polycrystalline silicon film 4 increased to about 3.1 μm (the crystal grain diameter of the polycrystalline silicon film formed by the conventional process was about 0.8 μm).

Then, a third embodiment in which the surface treatment is conducted with an ammonium hydrogen peroxide aqueous solution will be explained with reference of FIGS. 4 to 9 as in the first and the second embodiments.

As in FIG. 4, the surface of a silicon wafer 1 is oxidized by exposing to an atmosphere of oxygen of 900° C. to form a silicon oxide film 2 in a film thickness of 20 nm. Then the surface of the silicon oxide film 2 is rinsed for 1 minute as the surface treatment with an ammonium hydrogen peroxide aqueous solution ($NH_4OH:H_2O_2:H_2O=1:1:5$), and rinsed with water and dried.

Figure 5:
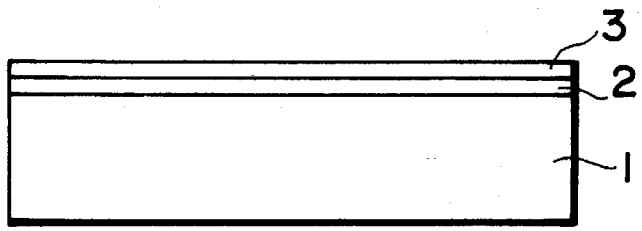
Figure 6:
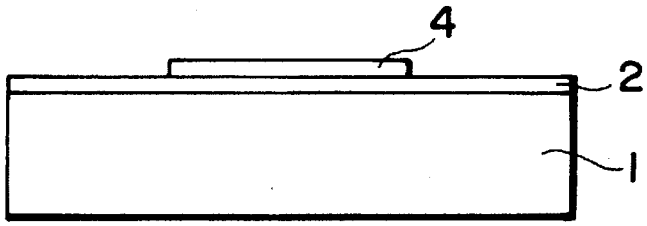

Next, as in FIG. 5, an amorphous silicon film 3 is deposited in a film thickness of 50 nm on the silicon oxide film 2 by CVD with $Si_2H_6$ gas at 480° C., and then is annealed for about 3 hours at 600° C. And a polycrystalline silicon film 4 is formed (as in FIG. 6). (The steps of FIGS. 7 to 9 follow as in the first embodiment.)

It was confirmed that the thus-formed polycrystalline silicon film with the surface treatment with the ammonium hydrogen peroxide aqueous solution had an increased crystal grain diameter of about 3.5 μm (the crystal grain diameter of the polycrystalline silicon film formed by the conventional process was about 0.8 μm).

Next, a fourth and a fifth embodiments in which the surface treatment is conducted respectively with water and water vapor will be explained with reference to FIGS. 4 to 9 as in the first to the third embodiments.

As in FIG. 4, the surface of a silicon wafer 1 is oxidized by exposing to an atmosphere of oxygen of 900° C. to form a silicon oxide film 2 of an about 20 nm film thickness. Then the surface of the silicon oxide film 2 is, as the surface treatment, rinsed with water of a resistivity of 16MΩ.cm in the fourth embodiment, and, in the fifth embodiment, is exposed for 10 minutes to water vapor prepared by burning hydrogen at 200° C. (at this time, the surface of the silicon oxide film 2 is not etched).

Then, an amorphous silicon film 3 is deposited in a film thickness of about 50 nm on the silicon oxide film 2 by CVD with $Si_2H_6$ gas at 480° C. and next is annealed for about 3 hours at 600° C. An polycrystalline silicon film 4 is formed as in FIG. 6. (The steps of FIGS. 7 to 9 follow as in the first embodiment.)

It was confirmed that the thus-formed polycrystalline silicon film 4 formed with the surface treatment with the water rinse had an increased crystal grain diameter of about 2.1 μm, and the polycrystalline silicon film 4 formed with the exposure to the water vapor had an increased crystal grain diameter of about 2.1 μm (the crystal grain diameter of the polycrystalline silicon film formed by the conventional process was about 0.8 μm).

As in FIG. 10(b), the fourth and the fifth embodiments can attain crystal grain diameters about 10 times those attained by the first, the second and the third embodiments, and it is needless to say that the fourth and the fifth embodiments are sufficiently effective also in comparison with the conventional process (the crystal grain density of the former is reduced down to about 1/10).

Next, a sixth embodiment in which the surface treatment is conducted with hydrogen-containing plasma will be explained with reference to FIGS. 4 to 9 as in the first to the fifth embodiments.

As in FIG. 4, the surface of a silicon wafer 1 is oxidized at 950° C. with water vapor to form a silicon oxide film 2 in an about 600 nm-thickness. The surface of the silicone oxide film 2 is, as the surface treatment, heated up to 300° C. and is exposed for 3 minutes to an atmosphere of hydrogen plasma.

Then, as in FIG. 5, an amorphous silicon film 3 is deposited on the silicon oxide film 2 by CVD with $Si_2H_6$ gas of 480° C. and annealed for about 3 hours at 600° C. And as in FIG. 6, a polycrystalline silicon film 4 is formed. (The steps of FIGS. 7 to 9 follow as in the first embodiment.)

It was confirmed that the thus-formed polycrystalline silicon film 4 has an increased crystal grain diameter of about 2.8 μm (the crystal grain diameter of the polycrystalline silicon film formed by the conventional process was about 0.8 μm.)

Next, a seventh embodiment in which a silicon oxide film 2 to be surface-treated is a CVD film (in the above-described embodiments the silicon oxide films 2 are formed by oxidizing the surfaces of the silicon wafers 1) with reference to FIGS. 4 to 9 as in the above-described embodiments.

As in FIG. 4, the silicon oxide film 2 as the substrate is deposited in an about 200 nm-thickness on the surface of silicon wafer 1 by CVD with $SiH_4$ gas and nitrous oxide gas at 820° C. The surface of the silicon oxide film 2 was rinsed, as the surface treatment, with ammonium hydrogen peroxide aqueous solution of 70° C. for 1 minute.

Then as in FIG. 5, an amorphous silicon film 3 is deposited in a 50 nm-thickness on the silicon oxide film 2 by CVD with $Si_2H_6$ gas at 480° C., and is annealed for about 3 hours at 600° C. And, as in FIG. 6, a polycrystalline silicon film 4 is formed. (The steps of FIGS. 7 to 9 follow as in the first embodiment.)

It was confirmed that the thus-formed polycrystalline silicon film 4 had an increased crystal grain diameter of about 2.9 μm (the crystal grain diameter of the polycrystalline silicon film formed by the conventional process was about 0.8 μm.)

In this seventh embodiment, the surface treatment was conducted with an ammonium hydrogen peroxide aqueous solution, but it was confirmed that the surface treatment with, in place of the ammonium hydrogen peroxide aqueous solution, a hydrogen fluoride aqueous solution, water, hydrogen fluoride gas or water vapor was as effective as that with the ammonium hydrogen peroxide aqueous solution.

The polycrystalline silicon film is doped with impurities for use in channels, gate electrodes or others. The inventors confirmed that increased crystal grain diameters of the doping polycrystalline silicon film suppress the diffusion of doped impurities (e.g., phosphorus, etc.) into the silicon oxide film. Thus, the process for forming a polycrystalline silicon film according to this invention is applicable generally to processes for fabricating semiconductor devices.

As described above, according to this invention, the surface of the silicon oxide film as the substrate is surface-treated with an etching liquid (hydrogen fluoride, ammonium hydrogen peroxide or others), an etching gas (hydrogen fluoride gas or others), water, water vapor or hydrogen plasma beforehand prior to the deposition of the amorphous silicon film, whereby the generation of crystalline nuclei due to the annealing of the amorphous silicon film is suppressed so as to increase grain diameters of the polycrystalline silicon film. Advantageously the use of such polycrystalline silicon film in TFTs can reduce the off current.

TFTs using such polycrystalline silicon film of increased crystal grain diameters can provide on/off ratios of $10^7$ order in comparison with those of $10^4$ order. Accordingly the use of such TFTs advantageously makes it possible to fabricate highly integrated memory cells.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A process performing a polycrystalline silicon film comprising:

surface-treating a surface of a silicon oxide film as a substrate to increase the amount of OH-groups on the surface of the silicon oxide film;

subsequently depositing an amorphous silicon film on the surface of the silicon oxide film; and annealing the amorphous silicon film to form a polycrystalline silicon film.

2. A process for forming a polycrystalline silicon film according to claim 1, wherein the silicon oxide film is a thin film obtained by directly oxidizing a surface of the substrate.

3. A process for forming a polycrystalline silicon film according to claim 1, wherein the silicon oxide film is a CVD film covering the substrate.

4. A process for forming a polycrystalline silicon film according to claim 1, wherein the surface-treatment is to rinse the surface of the silicon oxide film with an etching liquid.

5. A process for forming a polycrystalline silicon film according to claim 1, wherein the surface-treatment is to expose the surface of the silicon oxide film to an etching gas.

6. A process for forming a polycrystalline silicon film according to claim 1, wherein the surface-treatment is to rinse the surface of the silicon oxide film with water.

7. A process for forming a polycrystalline silicon film according to claim 1, wherein the surface-treatment is to expose the surface of the silicon oxide film with water vapor.

8. A process for forming a polycrystalline silicon film according to claim 1, wherein the surface-treatment is to expose the surface of the silicon oxide film to an atmosphere of hydrogen-containing plasma.

9. A process for forming a polycrystalline silicon film according to claim 1, wherein the amorphous silicon film is doped with at least one impurity.

10. A process for forming a polycrystalline silicon film according to claim 1, wherein the amorphous silicon film is deposited by CVD as a film covering the silicon oxide film.

11. A process for fabricating a thin film transistor comprising forming a polycrystalline silicon film to provide a channel, on a surface of a silicon oxide film as a substrate covering a silicon wafer, then forming a gate electrode on the polycrystalline silicon film, and forming a source region and a drain region in self-alignment in the polycrystalline silicon film, the polycrystalline silicon film being formed by conducting a surface-treatment for increasing the amount of OH groups on the surface of said silicon oxide film, then depositing an amorphous silicon film on said silicon oxide film, and annealing said amorphous silicon film.

12. A process for fabricating a thin film transistor according to claim 11, wherein the silicon oxide film as the undermost layer is a thin film obtained by directly oxidizing a surface of the silicon wafer.

13. A process for fabricating a thin film transistor according to claim 11, wherein the silicon oxide film as the undermost layer is a CVD film covering the silicon wafer.

14. A process for fabricating a thin film transistor according to claim 11, wherein the surface-treatment is to rinse the surface of the silicon oxide film with an etching liquid.

15. A process for fabricating a thin film transistor according to claim 11, wherein the surface-treatment is to expose the surface of the silicon oxide film with an etching gas.

16. A process for fabricating a thin film transistor according to claim 11, wherein the surface-treatment is to rinse the surface of the silicon oxide film with water.

17. A process for fabricating a thin film transistor according to claim 11, wherein the surface-treatment is to expose the surface of the silicon oxide film to water vapor.

18. A process for fabricating a thin film transistor according to claim 11, wherein the surface-treatment is to expose the surface of the silicon oxide film to an atmosphere of hydrogen-content plasma.

19. A process for fabricating a thin film transistor according to claim 11, wherein the amorphous silicon film is doped with impurities.

20. A process for fabricating a thin film transistor according to claim 11, wherein the amorphous silicon film is a CVD film covering the silicon oxide film.

21. A process performing a polycrystalline silicon film comprising:

surface-treating a surface of a silicon oxide film as a substrate to increase the amount of OH groups on the surface of the silicon oxide film;

subsequently depositing an amorphous silicon film on the surface of the silicon oxide film by using CVD method; and annealing the amorphous silicon film to form a polycrystalline silicon film.

22. A process for performing a polycrystalline silicon film comprising:

rinsing a surface of the silicon oxide film as a substrate with water;

subsequently depositing an amorphous silicon film on the surface of the silicon oxide film; and annealing the amorphous silicon film to form a polycrystalline silicon film.

23. A process performing a polycrystalline silicon film comprising:

exposing a surface of the silicon oxide film as a substrate with water vapor;

subsequently depositing an amorphous silicon film on a surface of the silicon oxide film; and annealing the amorphous silicon film to form a polycrystalline silicon film.

* * * * *